United States Patent
Wu et al.

(10) Patent No.: US 11,201,605 B2
(45) Date of Patent: Dec. 14, 2021

(54) BUFFER STAGE FOR USE WITH A CURRENT CONTROLLED OSCILLATOR

(71) Applicant: NXP USA, Inc., Austin, TX (US)

(72) Inventors: Jianzhou Wu, Suzhou (CN); Jiawei Fu, Suzhou (CN); Yang Wang, Suzhou (CN); Bin Zhang, Suzhou (CN)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/247,577

(22) Filed: Dec. 17, 2020

(65) Prior Publication Data

US 2021/0194467 A1    Jun. 24, 2021

(30) Foreign Application Priority Data

Dec. 24, 2019    (CN) .......................... 201911353719.2

(51) Int. Cl.
| | |
|---|---|
| H03K 3/00 | (2006.01) |
| H03K 3/017 | (2006.01) |
| H03K 3/354 | (2006.01) |
| H03K 19/003 | (2006.01) |
| H03K 3/012 | (2006.01) |
| H03K 17/687 | (2006.01) |
| H03K 19/20 | (2006.01) |

(52) U.S. Cl.
CPC ......... *H03K 3/012* (2013.01); *H03K 17/6872* (2013.01); *H03K 19/20* (2013.01)

(58) Field of Classification Search
None
See application file for complete search history.

(56) References Cited

U.S. PATENT DOCUMENTS

| | | | |
|---|---|---|---|
| 5,512,861 A | 4/1996 | Sharma | |
| 6,285,214 B1 | 9/2001 | Zipper | |
| 6,621,675 B2 * | 9/2003 | Ingino, Jr. ............... | G05F 1/575 323/901 |

* cited by examiner

*Primary Examiner* — Kenneth B Wells

(57) ABSTRACT

A buffer stage for amplifying a clock signal generated by a current controlled oscillator that receives a first current at a first supply voltage from a first current source. The buffer stage comprises an input terminal configured to receive the clock signal; an output terminal configured to output a buffered signal; at least one buffer, coupled between the input and output terminal, configured to receive a second current at a second supply voltage and buffer the clock signal to generate the buffered signal; a clamping circuit that receives the first current and the second current, and generates a first supply voltage and a second supply voltage. The clamping circuit clamps the second supply voltage equal to the first supply voltage.

20 Claims, 4 Drawing Sheets

BUFFER STAGE FOR USE WITH A CURRENT CONTROLLED OSCILLATOR

CROSS-REFERENCE TO RELATED APPLICATIONS

This application claims the priority under 35 U.S.C. § 119 of China application no. 201911353719.2, filed on 24 Dec. 2019, the contents of which are incorporated by reference herein.

BACKGROUND

The present invention relates to a current controlled oscillator and, more particularly, to a buffer stage for use with a current controlled oscillator.

Controlled oscillators are used in a variety of integrated circuits. For example, the integrated circuits can use controlled oscillators to generate clock signals to synchronize various functions performed by digital circuits. There are various types of controlled oscillators, and one of the most common types is a current controlled oscillator (CCO). The CCO includes series connected inverters that are controlled by a driving current for generating an output signal at a desired oscillating frequency, where the oscillating frequency is controlled by, and typically directly proportional to, the driving current.

The output signal of the CCO may be buffered by a buffer stage that is coupled to the output of the CCO. Conventionally, the buffer stage is usually implemented to share the supply voltage with the CCO. For example, the reference circuit may supply the CCO and the buffer stage with a fixed current, then the CCO oscillates and the buffer stage drives the output signal generated by the CCO. However, in ultra-low power applications, the fixed current supplying the CCO and the buffer stage may be only several nanoamperes and the majority of the fixed current may be supplied to the CCO, then the buffer stage may be only supplied by limited current which may cause weak driving capacity and may cause serious signal duty cycle degradation. And the power consumption of the circuit following the buffer stage may be high due to the buffer stage's weak driving capacity. In order to improve the buffer stage's driving capacity and to reduce the power consumption of the following circuit, the buffer stage may be supplied with more current, several nanoamperes current, which may decrease the current supplied to the CCO significantly. Then the oscillating frequency may decrease to a great extent which may lead to oscillation frequency accuracy degradation. The conventional buffer stage circuit for current controlled oscillator suffers from a trade-off between power consumption and oscillation frequency accuracy.

Thus, it would be desirable to have a buffer stage which not only reduces the power consumption but also is more robust against the oscillation frequency undershooting.

SUMMARY

This summary is provided to introduce a selection of concepts in a simplified form that are further described below in the Detailed Description. This summary is not intended to be relied on to identify key features or essential features of the claimed subject matter, nor is it intended to be used to limit the scope of the claimed subject matter.

According to a first aspect, there is provided a buffer stage for amplifying a clock signal generated by a current controlled oscillator (CCO) that receives a first current $I_{cco}$ from a first current source at a first supply voltage terminal $V_{cco}$, the buffer stage comprising:

an input terminal configured to receive the clock signal;

an output terminal configured to output a buffered signal;

at least one buffer, coupled between the input and output terminal, configured to buffer the clock signal to generate the buffered signal, the at least one buffer having at least one current control terminal that is coupled to a second current source to receive a second current $I_{buffer}$ at a second supply voltage terminal $V_{buffer}$;

a clamping circuit configured to receive the first current and the second current, and generate the first supply voltage $V_{cco}$ and the second supply voltage $V_{buffer}$, wherein the clamping circuit clamps the second supply voltage $V_{buffer}$ equal to the first supply voltage $V_{CCO}$.

In some embodiments, the clamping circuit includes a pair of NMOS transistors.

In some embodiments, the clamping circuit comprises:

a first transistor having a drain terminal coupled to the first current source configured to receive the first current, a gate terminal coupled to a drain terminal, a source terminal configured to provide the first supply voltage and a second transistor having a drain terminal coupled to the second current source configured to receive the second current, a gate terminal coupled to the gate terminal of the first transistor, and a source terminal configured to provide the second supply voltage which equals to the first supply voltage.

In some embodiments, the second transistor is scalable with regard to the first transistor.

In some embodiments, the second current source is an adjustable current source.

In some embodiments, the duty cycle of the clock signal is equal to the duty cycle of the buffered signal.

In some embodiments, the at least one buffer comprises an odd number of inverters connected in series, wherein each of the inverters receives part of the second current at the second supply voltage at a respective current control terminal thereof.

According to a second aspect, there is provided a system for amplifying a clock signal, the system comprising:

a current controlled oscillator (CCO) that receives a first current ($I_{cco}$) from a first current source at a first supply voltage and generates the clock signal, a buffer stage coupled to the CCO, wherein the buffer stage comprises:

a buffer stage, coupled to the ring CCO, configured to buffers the clock signal to generate the buffered signal, each of the at least one buffer having one current control terminal that is coupled to a second current source to receive part of a second current ($I_{buffer}$) at a second supply voltage, the sum of the current received by all of the at least one buffer equal to the second current ($I_{buffer}$);

a clamping circuit configured to receive the first current and the second current, and generate the first supply voltage and the second supply voltage, wherein the clamping circuit clamps the second supply voltage equal to the first supply voltage.

In some embodiments, the clamping circuit includes a pair of NMOS transistors.

In some embodiments, the clamping circuit comprises:

a first transistor having a drain terminal coupled to the first current source configured to receive the first current, a gate terminal coupled to a drain terminal, a source terminal configured to provide the first supply voltage and a second transistor having a drain terminal coupled to the second current source configured to receive the second current, a gate terminal coupled to the gate terminal of the first transistor, and a source terminal configured to provide the second supply voltage equal to the first supply voltage.

In some embodiments, the second transistor is scalable with regard to the first transistor.

In some embodiments, the second current source is an adjustable current source.

In some embodiments, the duty cycle of the clock signal is equal to the duty cycle of the buffered signal.

In some embodiments, the at least one buffer comprises an odd number of inverters connected in series, wherein each of the inverters receives part of the second supply voltage at a respective current control terminal thereof.

In some embodiments, the CCO comprises odd number of inverters connected in series between the clamping circuit and the buffer and an output of the last inverter in the series is connected to an input of the first inverter, wherein each of the inverters receives part of the first current at the first supply voltage ($V_{cco}$) from the clamping circuit and generates the clock signal.

In some embodiments, the system further comprises a reference start-up circuit that receives a first reference current and generates a start-up voltage.

In some embodiments, the first current source configured to receives a supply voltage and is connected to the reference start-up circuit for receiving the start-up voltage, and the first current source generates the first current using the start-up voltage; the second current source configured to receive the supply voltage and be connected to the reference start-up circuit for receiving the start-up voltage, and the second current source generates the second current using the start-up voltage.

In some embodiments, the system further comprises a level shifter configured to receive the supply voltage and coupled to the output terminal of the buffer stage for receiving the buffered signal, wherein the level shifter receives a third current from a third current source and generates an output signal ($V_{out}$).

According to a third aspect, there is provided a method for amplifying a clock signal generated by a ring current controlled oscillator (CCO) that receives a first current at a first supply voltage, the method comprising:

providing the clock signal to an input terminal of a buffer stage;

providing a second current and a second supply voltage to at least one current control terminal of the buffer stage while the buffer stage generates a buffered signal, wherein each of the at least one current control terminal receiving part of the second current ($I_{buffer}$) at the second supply voltage ($V_{buffer}$), the sum of the current received by all of the at least one current control terminal equal to the second current ($I_{buffer}$);

wherein providing the second supply voltage including clamping the second supply voltage equal to the first supply voltage and then providing the second supply voltage to the at least one current control terminal of the buffer stage.

In some embodiments, the clock signal has a first duty cycle and the buffered signal has a second duty cycle; and wherein the first duty cycle equals the second duty cycle.

BRIEF DESCRIPTION OF THE DRAWINGS

So that the manner in which the above recited features of the present application can be understood in detail, a more particular description of the application, briefly summarized above, can be had by reference to embodiments, some of which are illustrated in the appended drawings. It is to be noted, however, that the appended drawings illustrate only typical embodiments of this application and are therefore not to be considered limiting of its scope, for the application can admit to other equally effective embodiments. The drawings are for facilitating an understanding of the application and thus are not necessarily drawn to scale. Advantages of the subject matter claimed will become apparent to those skilled in the art upon reading this description in conjunction with the accompanying drawings, in which like reference numerals have been used to designate like elements, and in which:

DETAILED DESCRIPTION

Figure 1:
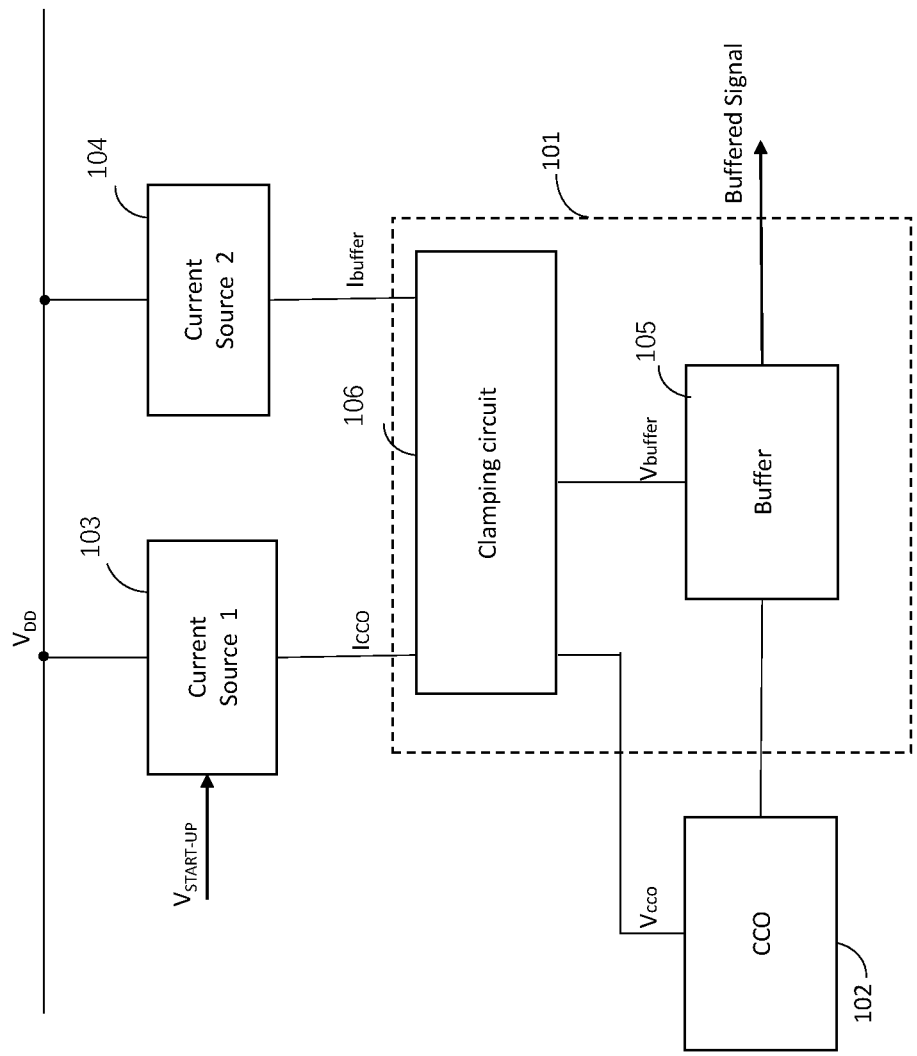
FIG. 1 is a schematic block diagram of a buffer stage coupled to a current controlled oscillator (CCO) in accordance with an embodiment of the present invention.

FIG. 1 shows, schematically, an example embodiment of a current controlled oscillator (CCO) and a buffer stage. Referring to FIG. 1, a buffer stage 101 is coupled to a current controlled oscillator (CCO) 102 for amplifying a clock signal generated by the CCO 102.

A first current source 103 is connected to a reference start-up circuit (not shown in FIG. 1) and receives a start-up voltage $V_{start-up}$. The first current source 103 also receives a supply voltage $V_{DD}$ from a positive voltage supply rail $V_{DD}$, and generates the CCO current $I_{cco}$, which is provided to the CCO 102. The CCO current ICCO is for regulating the oscillating frequency of the clock signal.

The CCO 102 receives the first current $I_{cco}$ from the first current source 103, at a first supply voltage $V_{cco}$, and generates the clock signal.

A second current source 104 is connected to the reference start-up circuit (not shown in FIG. 1) and receives the start-up voltage $V_{start-up}$. The second current source 104 receives the same supply voltage $V_{DD}$ from the positive voltage supply rail $V_{DD}$, and generates the buffer current $I_{buffer}$, which is provided to the buffer stage 101. The second current source 104 is an adjustable current source.

The buffer stage 101 comprises an input terminal that receives the clock signal and an output terminal that outputs a buffered signal. The buffer stage 101 further comprises at least one buffer 105 coupled between the input terminal and the output terminal. The at least one buffer 105 has a current control terminal that is coupled to the second current source 104 to receive the second current $I_{buffer}$, at a supply voltage terminal $V_{buffer}$. Each of the at least one buffer has one current control terminal configured to be coupled to the second current source to receive at least part of the second current $I_{buffer}$ at the second supply voltage terminal $V_{buffer}$, the sum of the current received by all of the current control terminals equals the second current $I_{buffer}$. In embodiments where there is more than one buffer 105, the second current is divided between the buffers.

The buffer stage 101 further comprises a clamping circuit 106. The clamping circuit 106 receives the first current $I_{cco}$ and the second current $I_{buffer}$, and generates the first supply voltage $V_{cco}$ and the second supply voltage $V_{buffer}$. The clamping circuit clamps the second voltage equal to the first supply voltage $V_{cco}$. And the buffer stage 101 buffers the clock signal generated by the CCO 102 to generate the buffered signal under the control of the second current $I_{buffer}$ and the second supply voltage $V_{buffer}$. Embodiments of the present invention may be used, and may be beneficial, in ultra-low power applications. In such applications, the sum of $I_{cco}$ and $I_{buffer}$ may be as low as only several nanoamperes (nA). Furthermore, the supply voltage, applied to the CCO may be relatively low; for instance, in one or more embodiments the voltage $V_{DD}$ may be 3V and the voltage $V_{CCO}$ may be 0.6V or less.

Thus, by providing the second current $I_{buffer}$ from the second current source 104 to the buffer stage, the buffer stage will not compete with the CCO 102 for sourced current. Thereby, the frequency accuracy of the CCO 102 may be improved.

Conventionally, the supply voltage of the buffer stage may be different from the supply voltage of the CCO. For example, the duty cycle of the clock signal may be 50% which means the pull up capability may equal to the pull down capability of the CCO. If the supply voltage of the buffer stage is smaller than the supply voltage of the CCO, the pull up capability is decreased, then the duty cycle of the buffered signal may be less than 50% which is different from the duty cycle of the clock signal. In the present invention, since the supply voltage of the buffer stage $V_{buffer}$ is clamped by the supply voltage of the CCO $V_{cco}$, it may be possible to ensure the buffered signal has a duty cycle that is substantially equal to the duty cycle of the clock signal generated by the CCO 102. In addition, the buffer stage's driving capacity may be enhanced to a great extent since the buffer stage can be supplied by a larger DC current than the current supplied to the conventional buffer stage.

Figure 2:
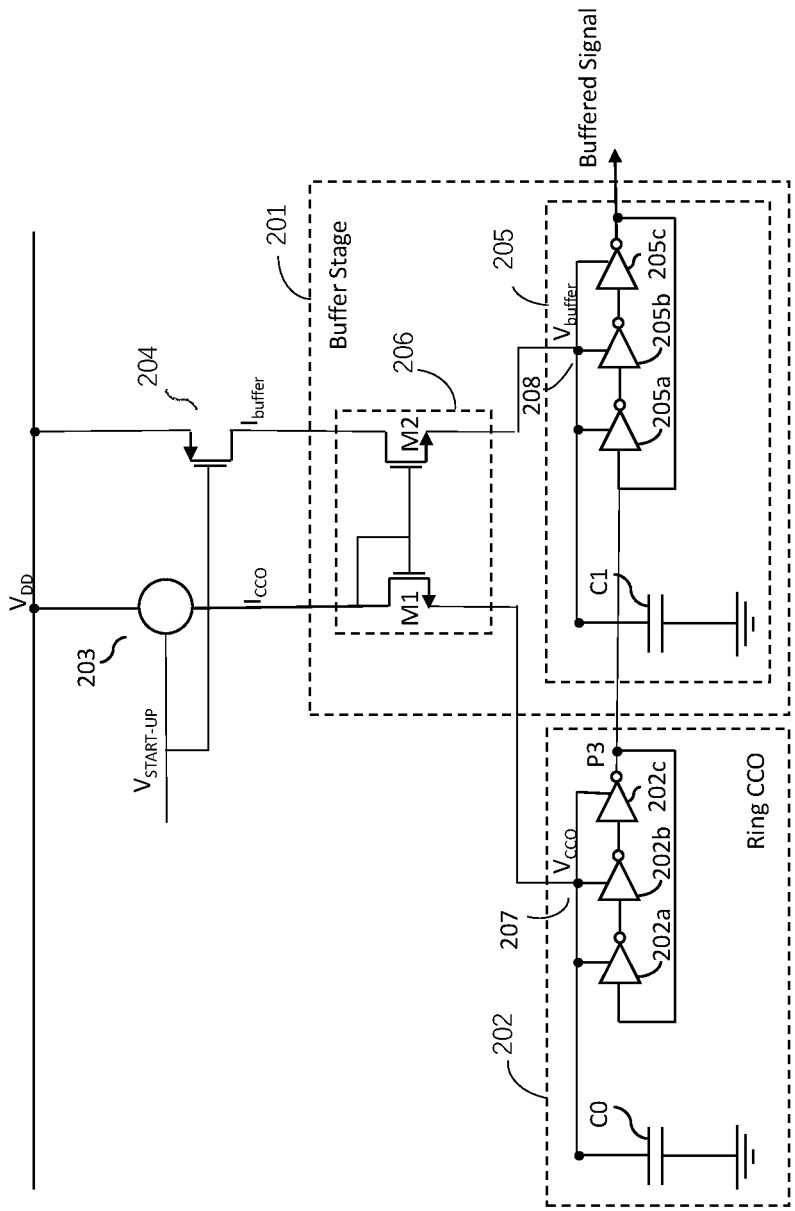
FIG. 2 is a detailed diagram of the circuit of FIG. 1 in accordance with an embodiment of the present invention.

Referring to FIG. 2, this shows a detailed diagram of a circuit in accordance with FIG. 1, in accordance with one or more embodiments of the present invention.

The first current source 203 has a high side and a low side. The high side of the first current source 203 is connected to a positive voltage supply rail $V_{DD}$, and its low side coupled to the high side of a three stage ring CCO 202, via the clamping circuit 206.

The second current source 204 may be implemented as a PMOS transistor as shown. The source terminal of the transistor constitutes the high side of the current source whilst the drain terminal constitutes the low side. The gate terminal of the transistor receives the start-up voltage $V_{start-up}$. The second current source 204 has its high side connected to $V_{DD}$, and its low side coupled to the high side of a three stage buffer circuit 205, via the clamping circuit 206.

Both of the first current source 203 and the second current source 204 are adjusted by the start-up voltage $V_{start-up}$.

The clamping circuit 206 includes a pair of NMOS transistors. In one or more embodiments, the clamping circuit 206 comprises an NMOS transistor M1 and an NMOS transistor M2. The NMOS transistor M1 has a gate terminal coupled its drain terminal, which is also coupled to the current source 203 that receives the CCO current, a source terminal coupled to the CCO to provide the CCO current $I_{cco}$ at the CCO supply voltage $V_{cco}$, and the NMOS transistor M2 has a drain terminal coupled to the current source 204 that receives the buffer current, a gate terminal coupled to the gate terminal of the transistor M1, and a source terminal coupled to the buffer circuit to provide the buffer current $I_{buffer}$ at the buffer supply voltage $V_{buffer}$ which, as will be discussed in more detail below, typically is equal to the CCO supply voltage $V_{cco}$.

In operation, when transistor M1 receives the CCO current $I_{cco}$, transistor M1 generates a voltage $V_{GS1}$ between the gate and source of M1. When transistor M2 receives the buffer current $I_{buffer}$, transistor M2 generates a voltage $V_{GS2}$ between the gate and source of M2. Because the gate of M1 is coupled to the gate of M2, the gate voltage of M1 is equal equals to gate voltage of M2. Then if $V_{GS}1$ equals to $V_{GS2}$, the buffer supply voltage $V_{buffer}$ equals to the CCO supply voltage $V_{cco}$.

In one or more embodiments, in order to provide the buffer supply voltage $V_{buffer}$ equal to the CCO supply voltage $V_{cco}$, the size of the second transistor M2 can be scalable with regard to the transistor M1. The size relationship between NMOS transistor M1 and M2 could be set as below.

When NMOS device works in a subthreshold region, the current equation is $I_{cco}=I_{s0}*(W/L)_1*exp((V_{GS1}-V_{th})/V_T)$. $I_{s0}$ is the current when $V_{GS1}=V_{th}$. $V_{GS1}$ is the voltage between the gate and source of M1. The current equation can be simplified to $I_{cco}=I_s*exp(V_{GS1}/V_T)$, so $Is=I_{s0}*(W/L)_1*exp((V_{GS1}-V_{th})/V_T)$. $V_T=kT/q$, k is the Boltzmann factor and q the charge of an electron such that kT/q is about 26 mV at room temperature (at 300 K or 27° C.).

$I_{cco}=I_s*exp(V_{GS1}/V_T)$; and $I_{buffer}=M*I_s*exp(V_{GS2}/V_T)$;

$\Delta V_{GS}=V_{buffer}-V_{cco}=V_T*ln(M*I_{cco}/I_{buffer})$.

So, for an example embodiment in which $I_{cco}=10I_{buffer}$, $\Delta V_{GS}=V_T*ln$ (M*10), wherein M is the size ratio: $(W/L)_2=M*(W/L)_1$. $(W/L)_1$ and $(W/L)_2$ are gate dimensional ratios of NMOS transistor M1 and M2.

In order to clamp $V_{buffer}$ and $V_{cco}$, the $\Delta V_{GS}=V_T*ln(M*10)=0$. M=1/10. Then the size relationship between NMOS transistor M1 and M2 can be $(W/L)_1=10*(W/L)_2$.

In other embodiments, $I_{cco}/I_{buffer}$ can take values other than 10: then, M can be changed according to $V_T*ln(M*I_{cco}/I_{buffer})=0$ As shown, ring CCO 202 comprises at least three inverters 202a, 202b and 202c. The high side of each inverter is connected to the node 207 which is coupled to the first current source 203 through the clamping circuit 206. The output of each inverter, starting with the inverter 202a, is connected to the input of the succeeding inverter. The output of the last inverter 202c is connected to the input of the first inverter 202a, thereby forming the ring. The ring CCO 202 operates based on a gate delay of the inverters. The higher the number of inverters in the ring CCO 202, the higher the gate delay. Based on the CCO voltage $V_{cco}$ and the CCO current $I_{cco}$, the ring CCO 202 generates a clock signal with a first duty cycle.

In order to improve the noise rejection of the power source noise at high frequencies, an additional capacitor C0 may be coupled between the ground and the node 207.

The three-stage buffer circuit 205 including three inverters 205a, 205b and 205c is connected to the output of the ring CCO 202. The high side of each inverter is connected to the node 208 which is coupled to the second current source 204 through the clamping circuit 206. The low side of each inverter is connected to the ground. Each of the inverters 205a, 205b and 205c receives part of the buffer current $I_{buffer}$, at the second supply voltage $V_{buffer}$, at a respective current control terminal and the three stage buffer 205 generates the buffered signal.

In order to improve the noise rejection of the power source noise at high frequencies, an additional capacitor C1 may be coupled between the ground and the node 208.

In ultra-low power applications, the buffer stage 201, according to embodiments of the present disclosure has a separate supply voltage to that of the ring CCO 202; that to the buffer stage 201 is supplied by an adjustable current source 204. This may enhance the buffer stage's driving capacity and thereby reduce the following circuit's power consumption which is preferred in ultra-low power applications. The CCO's frequency accuracy may be improved because the buffer stage will not compete for current with the CCO. The buffer stage circuit also clamps the supply voltage of the buffer stage $V_{buffer}$ and the CCO $V_{cco}$ using a clamping circuit, which may be, as shown, implemented as a pair of NMOS transistors. This may assist to ensure the buffered signal has a duty cycle that is substantially equal to the duty cycle of the input signal.

Thereby the buffer stage 201 may not only improve the driving capacity to reduce the power consumption of the following circuit but also prevent or reduce the CCO's oscillation frequency accuracy degradation and signal duty cycle degradation.

Figure 3:
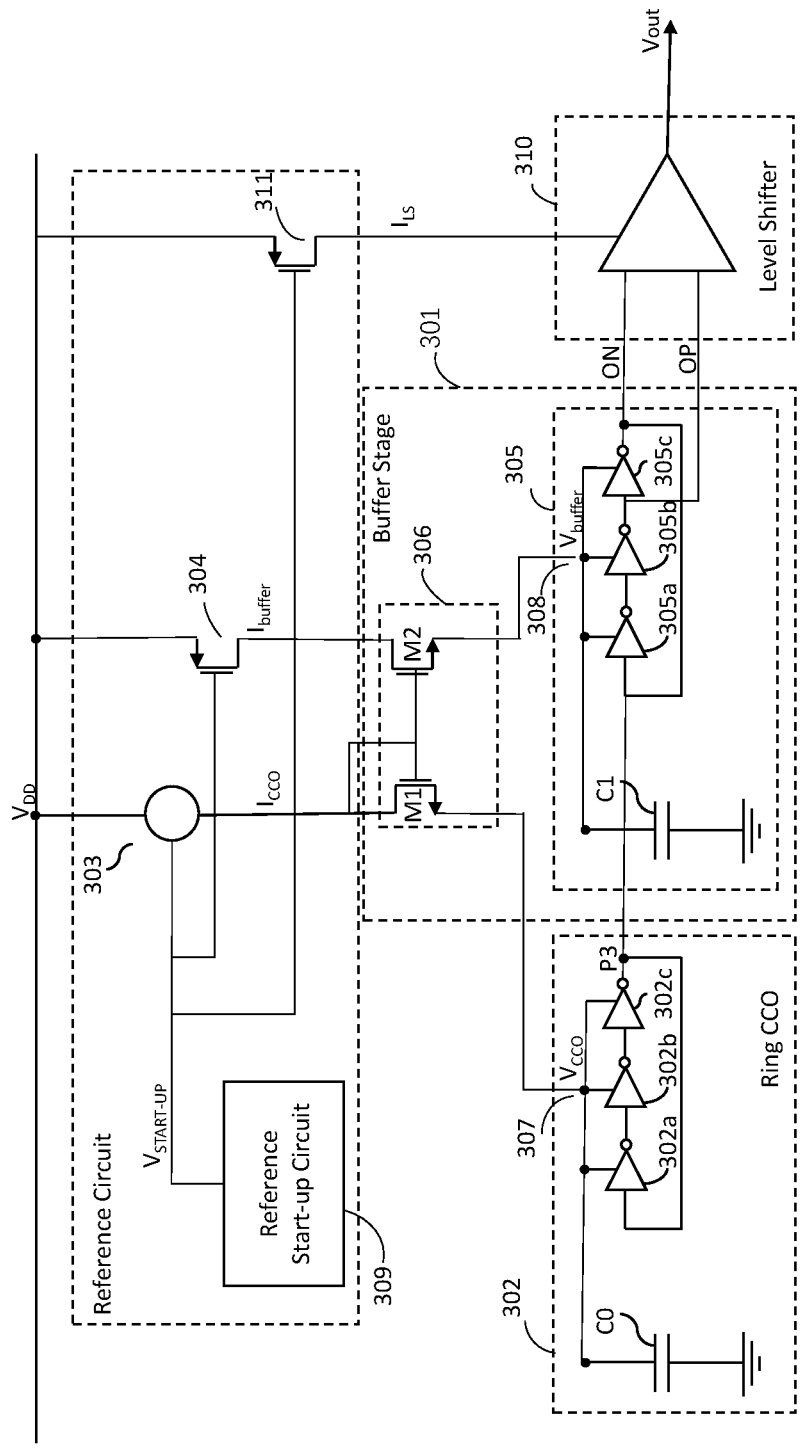
FIG. 3 is a schematic block diagram of a system including a buffer stage coupled to a current controlled oscillator (CCO) in accordance with an embodiment of the present invention.

Referring to FIG. 3, this figure shows a system 300 including a buffer stage 301 coupled to a current controlled oscillator (CCO) 302 according to one or more other embodiments. It differs from FIG. 2 in that the system 300 further comprises a reference start-up circuit 309 that generates the start-up voltage $V_{start-up}$; and comprises a level shifter 310.

In one or more embodiments, the gate terminals of level shifter 310 are coupled to the output terminals of the buffer stage 301 for receiving the buffered signal. The input positive terminal of the level shifter 310 is coupled to the output positive terminal of the buffer stage 301. The input negative terminal of the level shifter 310 is coupled to the output negative terminal of the buffer stage 310. And the level shifter 310 receives a third current ILS from a third current source 311 and generates an output signal $V_{out}$. The output signal $V_{out}$ is a level-shifted buffered clock signal. The third current source 311 has its high side connected to the positive voltage supply rail $V_{DD}$, and its low side connected to the level shifter 310. The power consumption of the level shifter 310 can be reduced due to the buffer stage's driving capacity enhancement, relative to conventional buffer stages.

Figure 4:
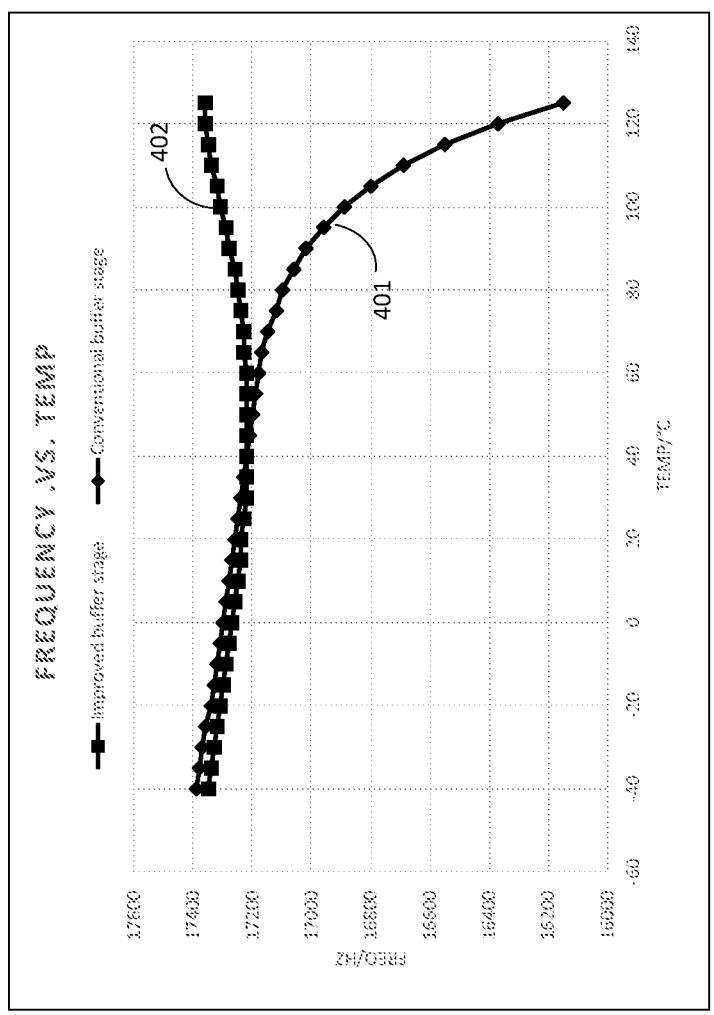
FIG. 4 is a diagram which shows the frequency simulation results on node P3 of the ring CCO in accordance with an embodiment of the present invention.

Referring to FIG. 4, a diagram shows frequency simulation results at the node P3 of the CCO of FIG. 3 in accordance with one or more embodiments of the present invention.

The simulation measures the frequency of the CCO output signal across a temperature range from −40° C. to 125° C. The curve (line 401) of a conventional buffer stage which shares the supply voltage with the CCO has a severe frequency drop at high temperature while the curve (line 402) of the buffer stage according to embodiments of the present invention, which separates the supply voltage from the CCO, has a relatively flat frequency response over the full temperature range. Thus from the simulation results, and/or from experiments it can be shown that the system may work better if the buffer stage's supply voltage is separated from CCO and clamped by the supply voltage of CCO.

The use of the terms "a" and "an" and "the" and similar references in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the application as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

The invention claimed is:

1. A buffer stage for amplifying a clock signal generated by a current controlled oscillator (CCO) that receives a first current at a first supply voltage terminal from a first current source, the buffer stage comprising:
    an input terminal configured to receive the clock signal;
    an output terminal configured to output a buffered signal;
    at least one buffer, coupled between the input terminal and the output terminal, configured to buffer the clock signal to generate the buffered signal, the at least one buffer receiving a second current at a second supply voltage terminal from a second current source; and
    a clamping circuit configured to receive the first current and the second current, and to generate the first supply voltage and the second supply voltage, terminal wherein the clamping circuit clamps the second supply voltage equal to the first supply voltage.

2. The buffer stage according to claim 1, wherein each of the at least one buffer has a current control terminal configured to be coupled to the second current source to receive at least part of the second current at the second supply voltage terminal, and the sum of the current received by all of the current control terminals is equal to the second current.

3. The buffer stage according to claim 1, wherein the clamping circuit includes a pair of NMOS transistors.

4. The buffer stage according to claim 1, wherein the clamping circuit comprises:
  a first transistor having a gate terminal coupled to a drain terminal and coupled to the first current source configured to receive the first current, a source terminal configured to provide the first supply voltage, and
  a second transistor having a drain terminal coupled to the second current source configured to receive the second current, a gate terminal coupled to the gate terminal of the first transistor, and a source terminal configured to provide the second supply voltage which is equal to the first supply voltage.

5. The buffer stage according to claim 3, wherein the second transistor is scalable with regard to the first transistor.

6. The buffer stage according to claim 1, wherein the second current source is an adjustable current source.

7. The buffer stage according to claim 1, wherein the duty cycle of the buffered signal is equal to the duty cycle of the clock signal.

8. The buffer stage according to claim 1, wherein the at least one buffer comprises an odd number of inverters connected in series, and each of the inverters receives the second supply voltage at a respective current control terminal thereof.

9. A system for buffering a clock signal, the system comprising:
  a current controlled oscillator (CCO) configured to receive a first current at a first supply voltage terminal from a first current source and generate the clock signal,
  a buffer stage coupled to the CCO, wherein the buffer stage comprises:
    at least one buffer, coupled to the CCO, configured to buffer the clock signal to generate the buffered signal, the at least one buffer receiving a second current at a second supply voltage terminal from a second current source; and;
    a clamping circuit configured to receive the first current and the second current, and generate a first supply voltage provided to the CCO and a second supply voltage provided to the at least one buffer, wherein the clamping circuit clamps the second supply voltage equal to the first supply voltage.

10. The system according to claim 9, wherein each of the at least one buffer has a current control terminal configured to be coupled to the second current source to receive at least part of the second current at the second supply voltage terminal, and the sum of the current received by all of the current control terminals is equal to the second current.

11. The system according to claim 9, wherein the clamping circuit includes a pair of NMOS transistors.

12. The system according to claim 9, wherein the clamping circuit comprises:
  a first transistor having a gate terminal coupled to a drain terminal and coupled to the first current source configured to receive the first current, and a source terminal configured to provide the first supply voltage, and
  a second transistor having a drain terminal coupled to the second current source configured to receive the second current, a gate terminal coupled to the gate terminal of the first transistor, and a source terminal configured to provide the second supply voltage which is equal to the first supply voltage.

13. The system according to claim 9, wherein the second transistor is scalable with regard to the first transistor.

14. The system according to claim 9, wherein the second current source is an adjustable current source.

15. The buffer stage according to claim 9, wherein the duty cycle of the clock signal is equal to the duty cycle of the buffered signal.

16. The system according to claim 9, wherein the at least one buffer comprises an odd number of inverters connected in series, wherein each of the inverters receives the second supply voltage at a respective current control terminal thereof.

17. The system according to claim 9, wherein the CCO comprises an odd number of inverters connected in series between the clamping circuit and the buffer and an output of the last inverter in the series is connected to an input of the first inverter, and each of the inverters receives at least part of the first current at the first supply voltage terminal from the clamping circuit and generates the clock signal.

18. The system according to claim 9, wherein the system further comprises a reference start-up circuit that receives a first reference current and generates a start-up voltage.

19. A method for amplifying a clock signal generated by a ring current controlled oscillator (CCO), the method comprising:
  providing a first current at a first supply voltage terminal from a first current source;
  providing the clock signal to an input terminal of a buffer stage;
  providing a second current at a second supply voltage terminal from a second current source to the buffer stage while the buffer stage generates a buffered signal; and
  wherein providing the second current at the second supply voltage includes clamping the second supply voltage equal to the first supply voltage and then providing the second supply voltage to the buffer stage.

20. The method according to claim 19, wherein the clock signal has a first duty cycle and the buffered signal has a second duty cycle; and
  wherein the first duty cycle is equal to the second duty cycle.

* * * * *